(12) United States Patent
Gouin

(10) Patent No.: US 7,746,162 B2
(45) Date of Patent: Jun. 29, 2010

(54) APPARATUS AND METHOD FOR WAKING UP A CIRCUIT

(75) Inventor: Vincent Gouin, Mandelieu (FR)

(73) Assignee: Infineon Technologies AG, Neubiberg (DE)

( * ) Notice: Subject to any disclaimer, the term of this patent is extended or adjusted under 35 U.S.C. 154(b) by 65 days.

(21) Appl. No.: 12/022,407

(22) Filed: Jan. 30, 2008

(65) Prior Publication Data

US 2009/0189684 A1 Jul. 30, 2009

(51) Int. Cl.
*G05F 1/10* (2006.01)
(52) U.S. Cl. .................................................. 327/538
(58) Field of Classification Search .............. 327/534, 327/535, 538, 543
See application file for complete search history.

(56) References Cited

U.S. PATENT DOCUMENTS

| | | | |
|---|---|---|---|
| 5,319,303 A * | 6/1994 | Yamada .................... 323/313 |
| 5,914,681 A | 6/1999 | Rundel | |
| 6,836,179 B2 | 12/2004 | Mizuno et al. | |
| 6,980,181 B2 * | 12/2005 | Sudo ......................... 345/82 |
| 6,982,915 B2 | 1/2006 | Houston et al. | |
| 7,042,274 B2 * | 5/2006 | Hazucha et al. ............ 327/534 |
| 7,051,260 B2 | 5/2006 | Ito et al. | |
| 7,200,054 B2 | 4/2007 | Horiguchi et al. | |
| 7,205,826 B2 * | 4/2007 | Kim et al. .................. 327/538 |
| 7,230,474 B2 * | 6/2007 | Yamamoto et al. ......... 327/543 |
| 7,253,594 B2 | 8/2007 | Paul et al. | |
| 7,260,694 B2 | 8/2007 | Flautner et al. | |
| 2004/0085690 A1 | 5/2004 | Ito et al. | |

* cited by examiner

*Primary Examiner*—Jeffrey S Zweizig
(74) *Attorney, Agent, or Firm*—Banner & Witcoff, Ltd.

(57) ABSTRACT

A method for waking up a circuit, comprising charging a voltage line of the circuit with a constant wake-up current until the voltage line reaches a predetermined voltage. Also, an apparatus, comprising a circuit portion, a switch configured to selectively couple an input of the circuit portion to a supply voltage, a current source configured to generate a first current, and a control circuit configured to control a state of the switch depending on the first current.

22 Claims, 4 Drawing Sheets

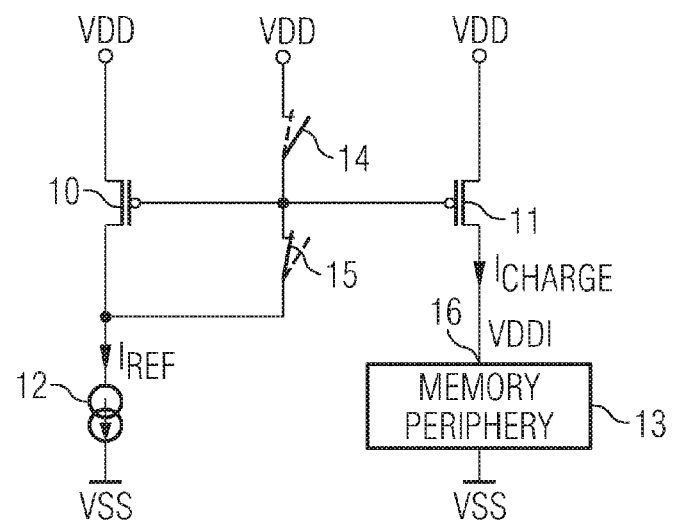
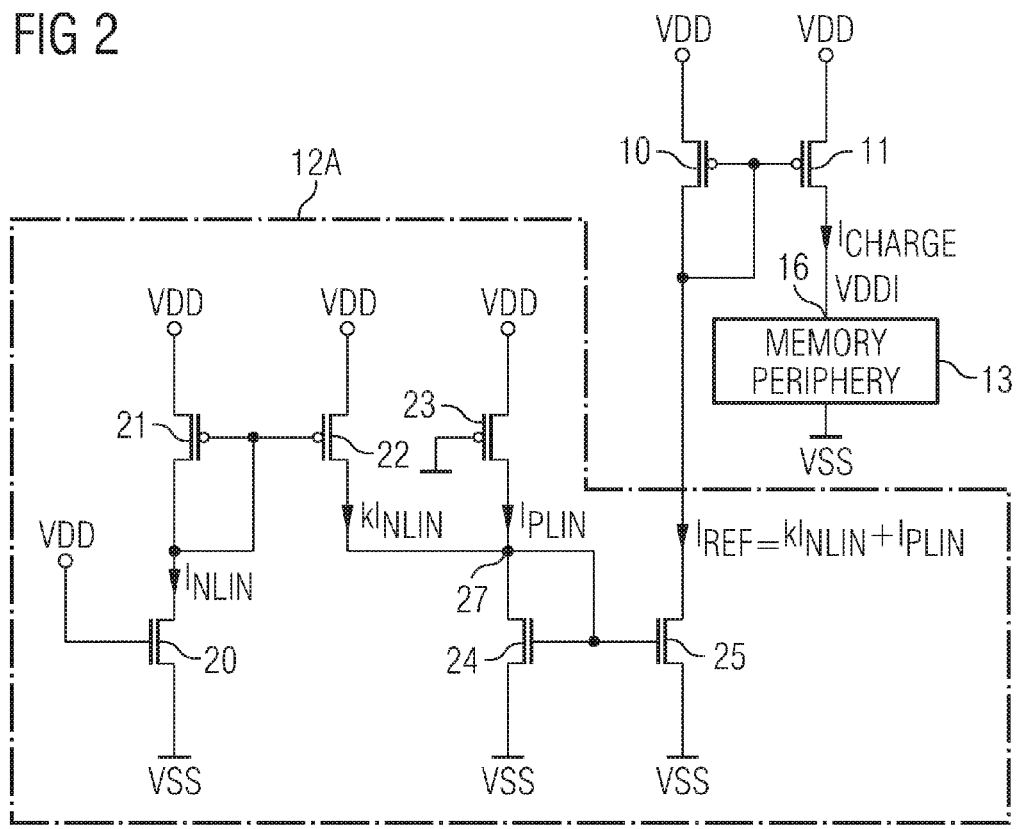

APPARATUS AND METHOD FOR WAKING UP A CIRCUIT

BACKGROUND

In modern electronic circuits, power consumption is an increasing concern. Generally, it is desirable to keep the power consumption as low as possible, which for example prolongs the battery lifetime in mobile applications and also reduces problems for example caused by heating of portions of the electronic device due to power dissipation.

Therefore, electronic circuits or portions thereof may be configured to have at least two modes of operation comprising an active mode or state where the electronic device or portion is operating normally and a sleep mode or state where the electronic circuit or portion thereof is inactive and its power consumption is reduced. Such a sleep mode may for example be obtained by separating the respective portion of the electronic circuit from a power supply, reducing the supply voltage of a power supply or connecting the portion of the electronic circuit to a power supply having a reduced supply voltage.

If an electronic circuit portion which is in sleep mode needs to be used, it is "woken up", i.e. put in the active mode. Depending on the application, the time needed for such a wake-up may be critical. Therefore, to enable the use of such a sleep mode even for applications where time may be critical, there is a need for a fast wake-up of such electronic circuit portions.

SUMMARY

Various aspects of the invention are described herein. For example, methods are provided for waking up a circuit. The method may comprise, for example, charging a voltage line of the circuit with a constant wake-up current until the voltage line reaches a predetermined voltage. Also various apparatus are provided. For example, an apparatus is provided that comprises a circuit portion, a switch configured to selectively couple an input of the circuit portion to a supply voltage, a current source configured to generate a first current, and a control circuit configured to control a state of the switch depending on the first current.

These and other aspects will be described in the Detailed Description with reference to various illustrative embodiments.

BRIEF DESCRIPTION OF THE DRAWINGS

Exemplary embodiments, which are not to be construed as limiting the scope of the invention, are described in the following with reference to the accompanying drawings, wherein:

FIG. 1 is a circuit diagram showing a first illustrative embodiment,

FIG. 2 is a circuit diagram showing a second illustrative embodiment,

DETAILED DESCRIPTION

Figure 3:
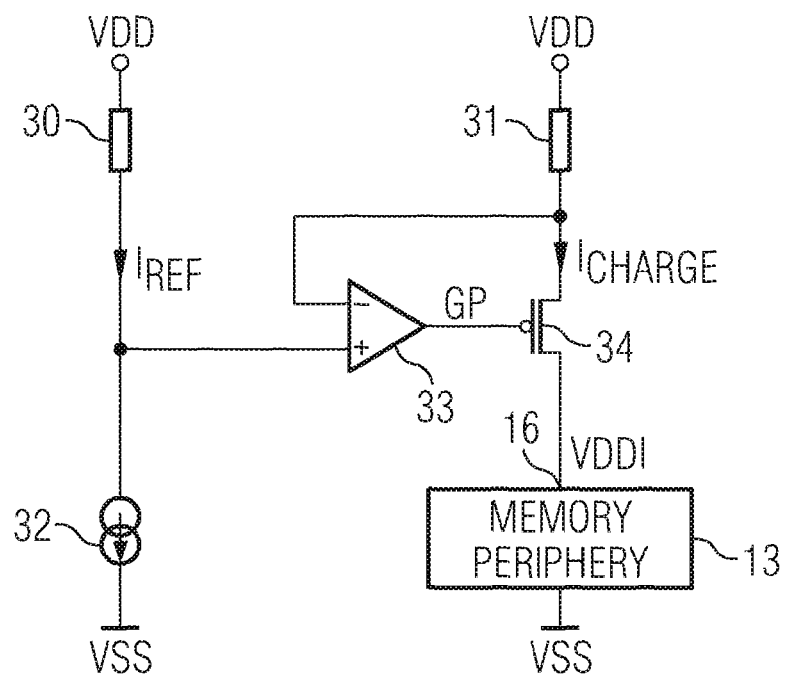
FIG. 3 is a circuit diagram showing a third illustrative embodiment.

In the following, various exemplary embodiments will be described in detail. It is to be understood that the following description is given only for the purpose of illustration and is not to be taken in a limiting sense. The scope of the invention is not intended to be limited by the exemplary embodiments described hereinafter.

It is also to be understood that in the following description of exemplary embodiments, any direct connection or coupling between functional blocks, devices, components, circuit elements or other physical or functional units shown in the drawings and described herein could also be implemented by an indirect connection or coupling, for example a connection or coupling comprising one or more additional intervening elements. Furthermore, it should be appreciated that functional blocks or units shown in the drawings as described herein may be implemented as separate circuits in embodiments, but may also be fully or partially implemented in a common circuit, for example an integrated circuit, in other embodiments.

It is to be understood that features of the various exemplary embodiments described herein may be combined with each other unless specifically noted otherwise.

Before turning to the actual description of exemplary embodiments, some terms used herein will be defined.

In at least some embodiments, electronic circuits or portions thereof will be described as having a sleep mode and an active mode. The active mode, in this respect, relates to a mode where the circuit performs its intended function. For example, the active mode of a memory circuit is a mode where data is read out from the memory and, in the case of a writable memory, data is written to the memory. In case of a logic circuit, the active mode is the mode where the respective logical operations are performed.

Conversely, "sleep mode" refers to a mode of operation where the activity of the electronic circuit is reduced or even non-existant, e.g. in order to save power. In some embodiments, a sleep mode for at least a portion of an electronic circuit is obtained by decoupling the electronic circuit or portion thereof from a power supply. In further embodiments, a sleep mode may be obtained by reducing, for example, a voltage of a voltage supply or by disconnecting the electronic circuit or a portion thereof from a power supply, for example a voltage line, used in the above-mentioned active mode and instead connecting the electronic circuit or portion thereof with a sleep power supply which for example may have a reduced voltage or a reduced current compared with the power supply used in active mode.

While various embodiments will be described as having a sleep mode and an active mode, this is not to be construed as limiting this disclosure to situations where an electronic device has a single sleep mode. It is equally possible in an embodiment of the invention that more than one sleep mode is provided, for example a first sleep mode where an electronic circuit or part thereof is disconnected from a power supply and a second sleep mode where the electronic circuit or part thereof is connected to a power supply having a reduced voltage, a reduced current or the like compared to the power supplied in active mode. Likewise, the various embodiments described herein are not to be construed as being limited to a single active mode.

The term "wake-up" is used herein to designate a transfer from a sleep mode to an active mode of an electronic circuit or portion thereof.

In FIG. 1, an electronic circuit according to a first illustrative embodiment is shown. In the embodiment of FIG. 1, a portion of a memory circuit comprising a memory periphery 13 is shown. In some embodiments, memory periphery 13 may be a memory periphery of a random access memory (RAM), such as a static RAM (SRAM), or a read-only memory (ROM) memory arrangement, although in other embodiments, other types of memories may be used.

Memory periphery 13 in operation of the memory circuit is supplied by an internal positive supply voltage VDDI and a negative supply voltage VSS, for example ground. A supply voltage input 16 of memory periphery 13 for supplying VDDI is coupled with an external positive supply voltage VDD via a p-type metal-oxide semiconductor (p-type MOS, or PMOS) transistor 11. In the embodiment of FIG. 1, PMOS transistor 11 serves as a switch for selectively connecting and disconnecting VDD from the supply voltage input 16. In the embodiment of FIG. 1, memory periphery 13 has a sleep mode and an active mode. In sleep mode, PMOS transistor 11 is essentially non-conducting along its load path, such that VDDI is decoupled from VDD, whereas in active mode, PMOS transistor 11 is conducting along its load path such that VDD is coupled with VDDI thus supplying memory periphery 13.

To switch between sleep mode and active mode, in the embodiment of FIG. 1, two switches 14 and 15 are provided. While in sleep mode, the switches assume the position shown in dashed lines, i.e. switch 14 being closed and switch 15 being open. While in active mode, the switches assume the position shown in solid lines, i.e. switch 14 being opened and switch 15 being closed. In some embodiments, switches 14 and 15 may be implemented as transistors, for example PMOS or n-type MOS (NMOS) transistors, wherein a closed state of the switch corresponds to a conducting state of the transistor.

Therefore, in sleep mode, a gate terminal of PMOS (for example) transistor 11 is coupled with VDD via switch 14 such that PMOS transistor 11 is essentially non-conducting thus decoupling VDD from input 16. This then leads to a decay of the voltage VDDI, for example to a level at or slightly above VSS.

In the embodiment of FIG. 1, furthermore a PMOS (for example) transistor 10 and a current source 12 are provided, wherein PMOS transistor 10 and PMOS transistor 11 when switch 15 is closed form a current mirror for a current $I_{REF}$ generated by current source 12. As will be explained in the following, $I_{REF}$ in the embodiment of FIG. 1 constitutes an upper limit for a charge current $I_{CHARGE}$ flowing when the memory periphery 13 is "woken up", i.e. brought from sleep mode to active mode. This waking up will be explained now in some more detail.

To wake up memory periphery 13, switch 14 is opened and switch 15 is closed, which may be performed simultaneously. The current mirror comprising PMOS transistors 10, 11 causes a current $I_{CHARGE}$ (which depends on $I_{REF}$) to flow such that VDDI eventually rises to a steady-state voltage, e.g. to VDD.

In the embodiment of FIG. 1, at the beginning of wake-up, i.e. shortly after switch 15 is closed and switch 14 is opened, $I_{CHARGE}$ is at least approximately equal to $I_{REF}$. With rising VDDI, $I_{CHARGE}$ decreases and becomes zero when VDDI has reached VDD. Therefore, as already mentioned above in the embodiment of FIG. 1 $I_{REF}$ constitutes an upper limit for $I_{CHARGE}$.

In some embodiments, $I_{REF}$ may be chosen such that it does not exceed a current flowing to or from the circuit portion to be woken up (e.g. memory periphery 13) during normal operation. For example, in the embodiment of FIG. 1 $I_{REF}$ my be chosen to be equal to or smaller than a maximum access current flowing during a memory access of the memory comprising memory periphery 13.

In the embodiment of FIG. 1, PMOS transistors 10 and 11 are designed to be equal, i.e. to have the same gate length, gate width etc. In other embodiments, PMOS transistors 10 and 11 may be designed to be unequal. In such other embodiments, $I_{CHARGE}$ may be limited to $\alpha \cdot I_{REF}$, $\alpha$ being a multiplier depending on the dimensions of PMOS transistors 10 and 11. In any event, $I_{CHARGE}$ is limited to an amount of current that depends on $I_{REF}$.

In further embodiments, $I_{REF}$ may be dependent on process, voltage and/or temperature variations (PVT) of the circuit. For example, the above-mentioned access current may depend on temperature variations, process variations of memory periphery 13 or other parts of the memory circuit comprising memory periphery 13, and/or voltage variations e.g. of positive supply voltage VDD and current source 12 in an embodiment may be configured such that $I_{REF}$ shows corresponding variations. A possible implementation of such an embodiment is presented in FIG. 2, which shows an electronic circuit according to a second illustrative embodiment.

Similar to the embodiment of FIG. 1, the electronic circuit of FIG. 2 comprises PMOS transistors 10, 11 and a memory periphery 13, and these elements will not be described again. Moreover, although not explicitly shown in FIG. 2, the electronic circuit shown in FIG. 2 may comprise one or more switches, such as switches 14,15 of FIG. 1, used for switching between sleep mode and active mode.

Furthermore, the electronic circuit shown in FIG. 2 comprises a current source 12A coupled with PMOS transistors 10, 11 in the same manner as current source 12 in FIG. 1. As illustrated in FIG. 2, current source 12A comprises an NMOS transistor 20, a first current mirror comprising PMOS transistors 21, 22, a PMOS transistor 23 and a second current mirror comprising NMOS transistors 24, 25.

NMOS transistor 20 is dimensioned and biased to operate in the linear, i.e. non-saturated, regime to generate a linear current $I_{NLIN}$. Via the first current mirror comprising PMOS transistors 21, 22 which in the embodiment of FIG. 2 operate in saturated regime, the current $I_{NLIN}$ is mirrored to a current $kI_{NLIN}$, wherein k is a scalar factor determined by the relative dimensions (e.g. gate length, gate width etc.) of PMOS transistors 21 and 22. In an embodiment where PMOS transistors 21 and 22 have approximately equal dimensions, k is approximately equal to 1.

PMOS transistor 23 is dimensioned and biased to operate in the linear regime and to generate a linear current $I_{PLIN}$, which at a node 27 is added to current $kI_{NLIN}$. The added currents are then mirrored by the second current mirror comprising NMOS transistors 24, 25 operating in the saturation regime to generate an output current $I_{REF}=kI_{NLIN}+I_{PLIN}$. In this embodiment, the second current mirror is configured such that the input current of the current mirror (i.e. the current flowing through NMOS transistor 24) is at least approximately equal to the output current (the current flowing through NMOS transistor 25), e.g. by designing NMOS transistors 24 and 25 to have substantially equal dimensions. In other embodiments, the second current mirror may be designed to scale the output current $I_{REF}$ relative to the input current.

In the embodiment of FIG. 2, the properties of NMOS transistor 20 and PMOS transistor 23 are subject to temperature variations and/or process variations, with corresponding variations of the reference current $I_{REF}$. In some embodiments, transistors 20 and 23 may be dimensioned similarly to, or the same as, transistors used in accessing the memory comprising memory periphery 13, such that temperature variations of the reference current $I_{REF}$ at least approximately correspond to temperature variations of the access current. In some embodiments, additionally or alternatively the circuit of FIG. 2 may be manufactured jointly with the transistors determining the access current (e.g. transistors incorporated in memory periphery 13) such that they are subject to the same process variations. Therefore, in those embodiments $I_{REF}$ may be subject to substantially the same temperature and/or process variations as the access current. Furthermore, in some embodiments current source 12A may be supplied by the same supply voltage as the transistors that determine the access current, such that they are subjected to essentially the same voltage variations.

In the embodiment of FIG. 2, switches may be provided for decoupling current source 12A from VDD and/or VSS during sleep mode. This may be done independently from the optional provision of switches like switches 14, 15 of FIG. 1.

In FIG. 3, an electronic circuit according to a third illustrative embodiment is shown. Similar to the embodiments of FIGS. 1 and 2, the embodiment of FIG. 3 comprises a memory periphery 13, a voltage input 16 for an internal supply voltage VDDI of memory periphery 13 being coupled with a positive supply voltage VDD via a PMOS transistor 34 serving as a switch and a resistor 31. In some embodiments, PMOS transistor 34 serves to decouple input 16 from VDD in sleep mode of memory periphery 13 and to couple input 16 with VDD in active mode. In other embodiments, PMOS transistor 34 is only used for a transition between sleep mode and active mode and/or vice versa, and one or more additional switches, such as transistors, may be provided to connect and disconnect voltage input 16 to/from positive supply voltage VDD in active mode and sleep mode, respectively. To switch between sleep mode and active mode, switches similar to those shown in FIG. 1 or similar to those that will be explained below with reference to FIG. 5 may be provided.

When the circuit of FIG. 3 is switched from sleep mode to active mode, VDDI is charged to its nominal active mode value, e.g. to VDD, by a charge current $I_{CHARGE}$, as already explained with reference to FIGS. 1 and 2. This charge current $I_{CHARGE}$ is controlled by a circuit portion comprising a resistor 30, a current source 32 generating a reference current $I_{REF}$ and an operational amplifier 33. An output of amplifier 33 is connected with a gate terminal GP of PMOS transistor 34. A negative input of amplifier 33 is connected with a node between resistor 31 and PMOS transistor 34. A positive input of amplifier 33 is connected with a node between resistor 30 and current source 32.

With the configuration of the embodiment shown in FIG. 3, amplifier 33 equalizes voltages at its positive and negative inputs by controlling the gate GP of PMOS transistor 34. In the embodiment of FIG. 3, the resistance of resistor 30 is equal to the resistance of resistor 31. In this case, the charge current $I_{CHARGE}$ is controlled to be equal to the reference current $I_{REF}$ generated by current source 32. In another embodiment of the invention, the resistance of resistor 30 is unequal to the resistance of resistor 31, such that $I_{CHARGE}$ is scaled with respect to $I_{REF}$.

In the embodiment of FIG. 3, $I_{CHARGE}$ is substantially equal to $I_{REF}$ during the whole charging operation, i.e. until VDDI has reached its nominal value when a wake up-operation is performed. This corresponds to a linear increase of VDDI as schematically shown in an exemplary manner in FIG. 4.

Figure 4:
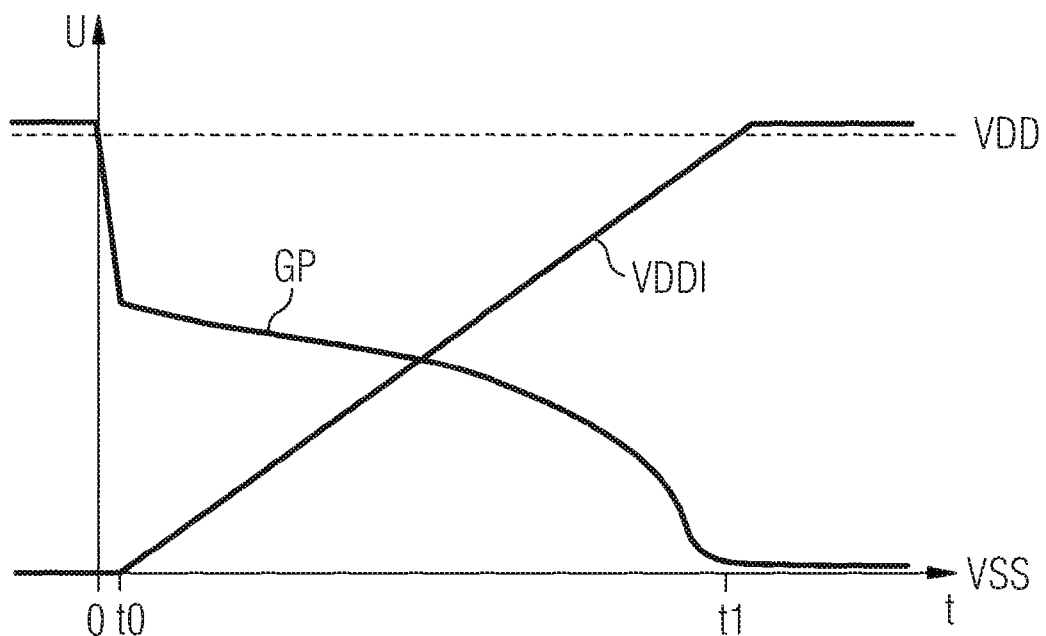
FIG. 4 is a diagram showing exemplary voltage curves in the embodiment of FIG. 3.

In FIG. 4, illustrative curves for the voltage VDDI and the voltage at gate GP of PMOS transistor 34 during wake-up are shown. These curves are merely intended to illustrate the working principle of the embodiment of FIG. 3, and depending on the implementation, real curves may differ from the illustrative curves of FIG. 4. Moreover, in FIG. 4 it is assumed that in active mode, VDDI is equal to VDD. In other embodiments, in active mode VDDI may also assume a predetermined value different from VDD, although that predetermined value may depend upon VDD.

As can be seen in FIG. 4, during wake-up first the voltage at gate GP drops rapidly between a time 0 and a time t0 from its value in sleep mode (e.g. VDD corresponding to a non-conducting state of PMOS transistor 34) to a value allowing the current $I_{CHARGE}$ equal to $I_{REF}$ to flow. Thereafter, between t0 and t1, the latter marking the end of the charging operation, the voltage at GP falls in a non-linear manner to its value in active mode, e.g. VSS corresponding to a fully opened PMOS transistor 34. Simultaneously, between t0 and t1 VDDI rises from VSS to VDD linearly corresponding to a constant charge current $I_{CHARGE}$.

In further embodiments, $I_{CHARGE}$ may be kept constant only during a part of the charging operation, e.g. for a predetermined period of time which is smaller than t1.

In the embodiment of FIG. 3, $I_{REF}$ may be selected in the same manner as already explained with reference to FIG. 1, e.g. depending on an access current of the memory comprising memory periphery 13.

Figure 5:
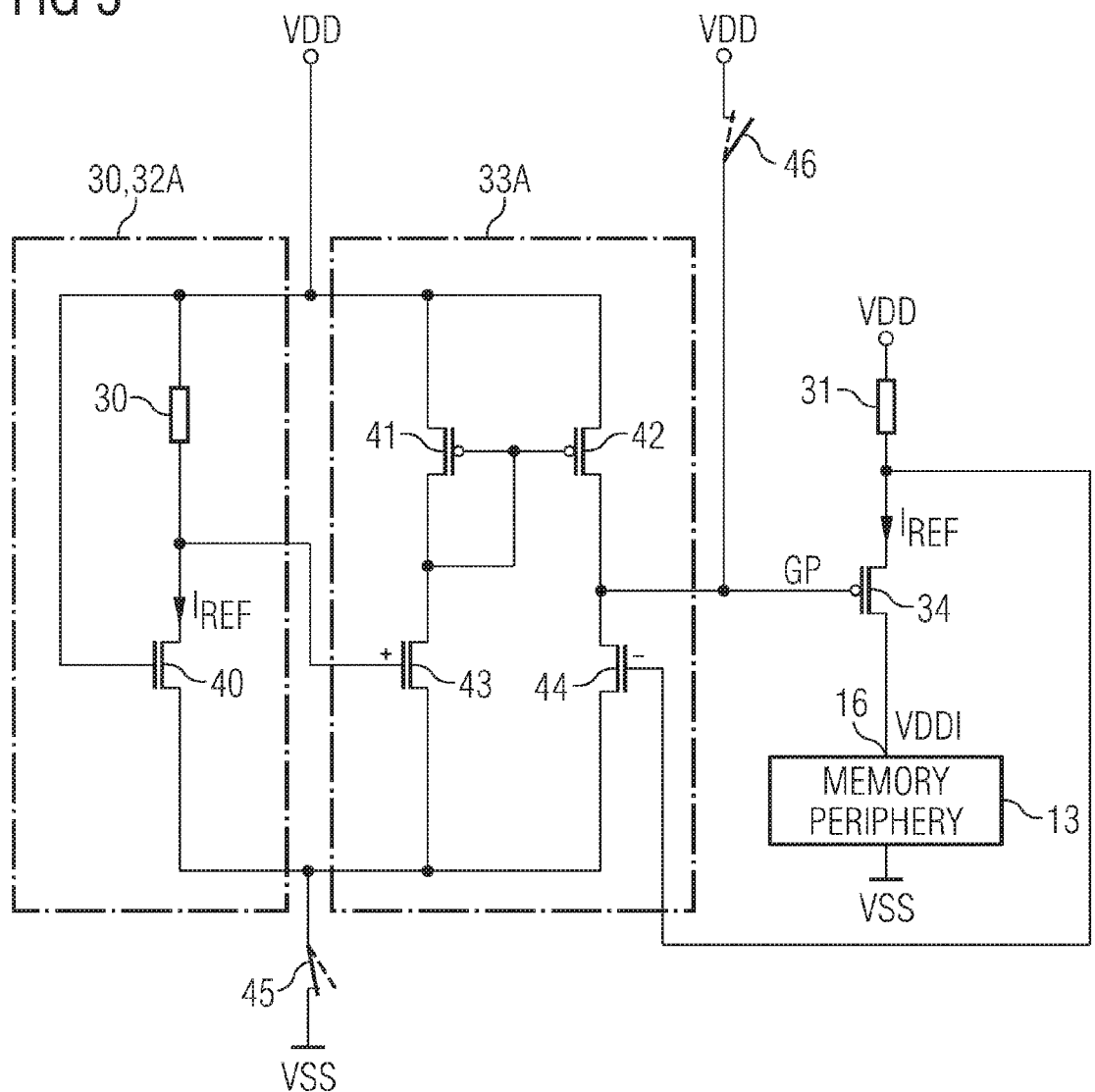
FIG. 5 is a circuit diagram showing a fourth illustrative embodiment.

In FIG. 5, a fourth illustrative embodiment is shown which is based on the embodiment of FIG. 3. Corresponding elements bear the same reference numerals and will not be described again in detail. In particular, resistors 30, 31, PMOS transistor 34 and memory periphery 13 correspond to those elements of FIG. 3 and have the same functions.

In the embodiment of FIG. 5, switches 45 and 46 are provided to switch the circuit between sleep mode and active mode. In sleep mode, switch 45 is open and switch 46 is closed as shown in dashed lines, and in active mode switch 45 is closed and switch 46 is open. Switch 46 essentially has the same function as switch 14 in the embodiment of FIG. 1, and switch 45 turns off a current source 32A and an operational amplifier 33A in sleep mode, i.e. decouples them from VSS, and turns them on in active mode. Switches 45, 46 may be implemented as transistors, for example PMOS or NMOS transistors.

Current source 32A and operational amplifier 33A have the same basic functions as current source 32 and operational amplifier 33 in the embodiment of FIG. 3.

As part of current source 32A in the embodiment of FIG. 5, an NMOS transistor 40 is provided between resistor 30 and VSS. The gate of transistor 40 is coupled with VDD. NMOS transistor 40 in some embodiments is designed such that it operates in saturated regime when switch 45 is closed such that the reference current $I_{REF}$ corresponds to the saturation current of NMOS transistor 40. In other embodiments, NMOS transistor 40 may be operated in the linear regime. In some embodiments, NMOS transistor 40 is dimensioned such that $I_{REF}$ is smaller than or equal to an access current flowing when accessing the memory comprising memory periphery 13.

Furthermore, in the embodiment of FIG. 5, operational amplifier 33A comprises a differential pair of NMOS transistors 43, 44, the gate terminals of which form the positive and negative inputs of amplifier 33A, respectively. Furthermore, amplifier 33A comprises a pair of PMOS transistors 41, 42 the gates of which are connected with each other and with a node between NMOS transistor 43 and PMOS transistor 41 as shown in FIG. 5. A node between PMOS transistor 42 and NMOS transistor 44 serves as output of amplifier 33A and is connected with gate GP of PMOS transistor 34.

The operating principle of the embodiment of FIG. 5 is the same as already described for the embodiment of FIG. 3 and will therefore not be described again in detail.

Figure 6:
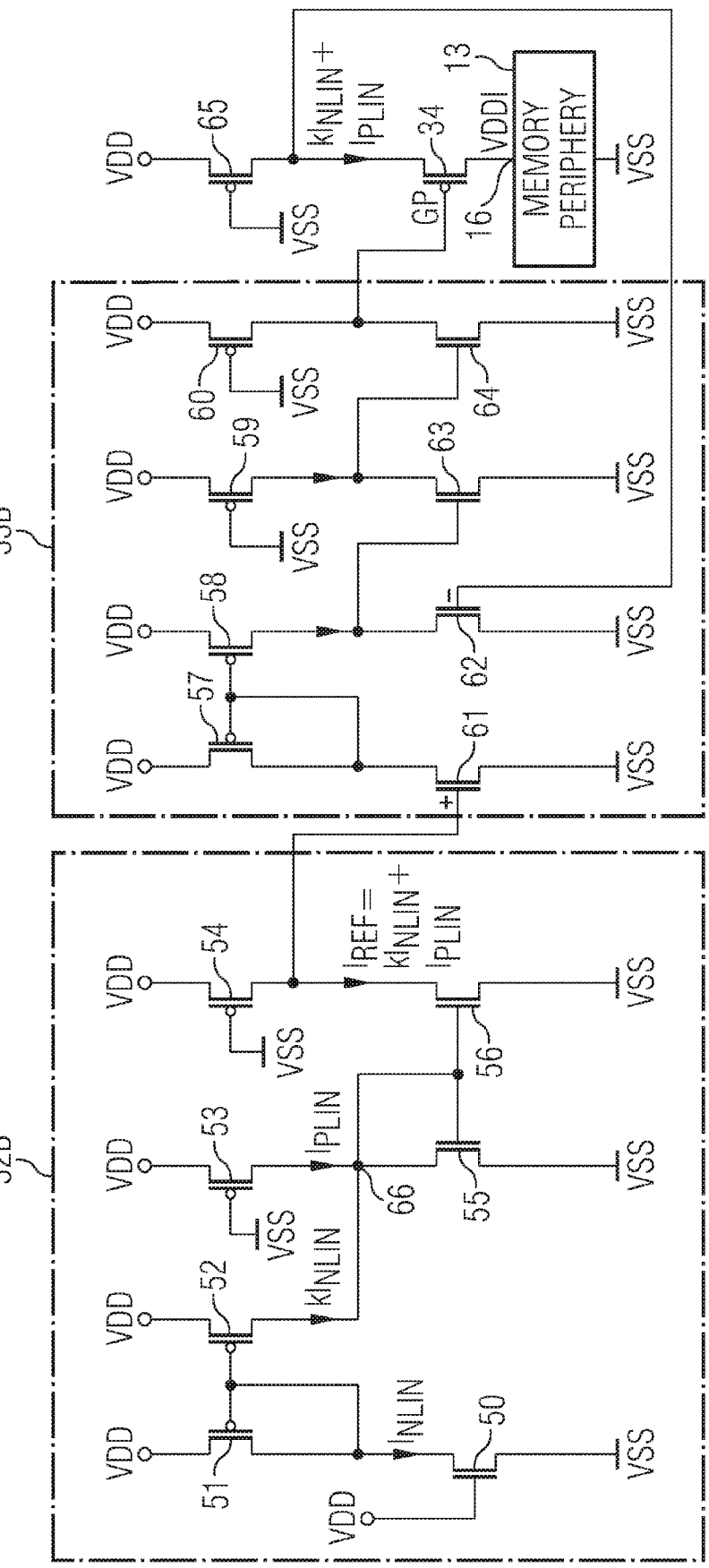
FIG. 6 is a circuit diagram showing a fifth illustrative embodiment.

In FIG. 6, a fifth illustrative embodiment is shown which is based on the embodiment of FIG. 3. Corresponding elements bear the same reference numerals and will not be described again in detail. In particular, PMOS transistor 34 and memory periphery 13 correspond to those elements of FIG. 3 and have the same functions. Moreover, the gates of PMOS transistors 54 and 65 are connected to VSS and basically serve the same function as resistors 30 and 31 of FIG. 3, respectively. Also, the circuit illustrated in FIG. 6 comprises a current source 32B and an operational amplifier 33B, which basically serve the same functions and are connected in a similar manner as current source 32 and operational amplifier 33 of the embodiment of FIG. 3, respectively.

As illustrated in FIG. 6, current source 32B comprises an NMOS transistor 50, a first current mirror comprising PMOS transistors 51, 52, a PMOS transistor 53 and a second current mirror comprising NMOS transistors 55, 56.

NMOS transistor 50 in the embodiment of FIG. 6 is dimensioned and biased to operate in the linear, i.e. non-saturated, regime to generate a linear current $I_{NLIN}$. Via the first current mirror comprising PMOS transistors 51, 52 which in the embodiment of FIG. 6 operate in saturated regime the current $I_{NLIN}$ is mirrored to a current $kI_{NLIN}$, wherein k is a scalar factor determined by the dimensions (e.g. gate length, gate width etc.) of PMOS transistors 51 and 52. In embodiments where PMOS transistors 51 and 52 have approximately equal dimensions, k is approximately equal to 1.

PMOS transistor 53 is dimensioned and biased to operate in the linear regime and to generate a linear current $I_{PLIN}$, which at a node 66 is added to current $kI_{NLIN}$. The added currents are then mirrored by the second current mirror comprising NMOS transistors 55, 56 operating in the saturation regime to generate an output current $I_{REF}=kI_{NLIN}+I_{PLIN}$. In this embodiment, the second current mirror is configured such that the input current of the current mirror (i.e. the current flowing through NMOS transistor 55) is at least approximately equal to the output current (the current flowing through NMOS transistor 56), e.g. by designing NMOS transistors 55 and 56 to have substantially equal dimensions. In other embodiments, the second current mirror may be designed to scale the output current $I_{REF}$ relative to the input current.

In the embodiment of FIG. 6, the properties of NMOS transistor 50 and PMOS transistor 53 are subject to temperature variations and/or process variations, with corresponding variations of the reference current $I_{REF}$. In an embodiment, transistors 50 and 53 are dimensioned similar to transistors used in accessing the memory comprising memory periphery 13, such that temperature variations of the reference current $I_{REF}$ at least approximately correspond to temperature variations of the access current. In some embodiments, additionally or alternatively, the circuit of FIG. 6 may be manufactured jointly with the transistors determining the access current (e.g. transistors incorporated in memory periphery 13) such that they are subject to the same process variations. Therefore, in some embodiments $I_{REF}$ may be subject to substantially the same temperature and/or process variations as the access current of the memory comprising memory periphery 13. Furthermore, in some embodiments current source 32B may be supplied by the same supply voltage as the transistors that determine the access current, such that they are subjected to essentially the same voltage variations.

In the embodiment of FIG. 6, operational amplifier 33B comprises a differential pair of NMOS transistors 61, 62 the gates of which form the positive and negative inputs of the operational amplifier, respectively. Furthermore, amplifier 33B comprises a pair of PMOS transistors 57, 58 the gates of which are connected with each other and with a node between NMOS transistor 61 and PMOS transistor 57 as shown in FIG. 5. This structure which basically corresponds to operational amplifier 33A of FIG. 5 in the embodiment illustrated in FIG. 6 is followed by a first inverter structure comprising a PMOS transistor 59 the gate of which is coupled with VSS and an NMOS transistor 63 the gate of which is coupled with a node between PMOS transistor 58 and NMOS transistor 62. This first inverter structure is followed by a second inverter structure comprising a PMOS transistor 60 the gate of which is coupled with VSS and an NMOS transistor 64 the gate of which is coupled with a node between PMOS transistor 59 and NMOS transistor 63. A node between PMOS transistor 60 and NMOS transistor 64 serves as output of amplifier 33B and is connected with gate GP of PMOS transistor 34 in the embodiment of FIG. 6.

To switch the electronic device between sleep mode and active mode in the embodiment of FIG. 6, switches like the ones explained with reference to FIG. 5 or FIG. 1 are provided. In other embodiments, other switching means may be provided, for example one or more switches may be provided for connecting and disconnecting portions of the circuit to/from VSS and/or VDD. In still further embodiments, in sleep mode VDD and/or VSS may be switched off or set to a level different from the level in active mode.

It is to be understood that the embodiments presented above are only intended to illustrate possible implementations of various aspects of the present invention, but are not to be construed as limiting. Further variations and modifications are possible, some of which will be outlined below.

For instance, features of the various embodiments described above may be exchanged or combined with each other where applicable. For instance, in the embodiment of FIG. 5, amplifier 33A may be replaced by amplifier 33B of FIG. 6, and/or resistors 30, 31 in FIG. 3 or 5 may be replaced by other circuit elements like transistors 54, 60 of FIG. 6.

Also, while in the embodiments described above a memory circuit, and in particular a memory periphery, has been used as an example for a circuit portion to be switched between sleep mode and active mode, in other embodiments other types of circuits may be employed, for example a logic circuit. Also, in some embodiments more than one circuit portion to be switched between active mode and sleep mode may be provided. Furthermore, while in the embodiments described above, as an example the reference current $I_{REF}$ may be selected dependent on an access current, $I_{REF}$ and consequently $I_{CHARGE}$ may be set to any desired value taking for example one or more of noise caused by the currents, energy dissipation and/or heating caused by the current, maximum currents tolerated by circuits elements involved and the like into account.

While in some of the embodiments specific current sources and/or operational amplifiers have been described in detail, other types of conventional current sources and/or operational amplifiers may be used as well. Further, while some embodiments employ particular types of current mirrors, other types of current mirrors may be used.

While in some of the above-described embodiments circuit portions based on PMOS and NMOS transistors have been described, in other embodiments other types of transistors, such as bipolar transistors, may be fully or partially used.

The invention claimed is:

1. A method for waking up a circuit, comprising charging a voltage line of the circuit with a constant wake-up current until the voltage line reaches a predetermined voltage, wherein the circuit comprises a memory circuit, and wherein the constant wake-up current is less than or equal to an access current of the memory circuit.

2. The method of claim 1, wherein charging comprises determining the constant wake-up current based on a reference current.

3. The method of claim 1, further comprising adapting the wake-up current to the access current depending on at least one of a process variation, a temperature variation, and a supply voltage variation.

4. An apparatus, comprising:
a circuit portion;
a switch configured to selectively couple a supply voltage input of the circuit portion to a supply voltage;
a current source configured to generate a first current that is smaller than or equal to a current flowing through the supply voltage input of the circuit portion during a normal operation of the circuit portion; and
a control circuit configured to control a state of the switch depending on the first current,
wherein the control circuit comprises an operational amplifier, an output of the operational amplifier being coupled with a control terminal of the switch.

5. The apparatus of claim 4, wherein the apparatus is configured such that when the switch is coupling the supply voltage input of the circuit portion to the supply voltage, a current flowing through the supply voltage input of the circuit portion is maintained at a constant value for a predetermined time period.

6. The apparatus of claim 4, wherein the switch comprises a transistor.

7. The apparatus of claim 4, wherein the control circuit comprises at least a portion of a current mirror circuit.

8. The apparatus of claim 4, wherein the current source comprises a transistor configured to be operated in a linear regime.

9. An apparatus, comprising:
a memory;
a first switch comprising a control terminal, a first terminal, and a second terminal, the first terminal configured to be coupled with a supply voltage and the second terminal coupled with an input of the memory;
an amplifier comprising an output coupled with the control terminal of the first switch, a first input coupled with the first terminal of the first switch, and a second input; and
a current source coupled with the second input of the amplifier.

10. The apparatus of claim 9, wherein the first input of the amplifier is a negative input and the second input of the amplifier is a positive input.

11. The apparatus of claim 9, wherein the first terminal of the first switch is coupled to a first circuit element, wherein the current source is coupled to a second circuit element, and wherein the second circuit element is configured to be coupled to the supply voltage.

12. The apparatus of claim 10, wherein the first circuit element and the second element are each selected from a group comprising a resistor and a transistor.

13. The apparatus of claim 9, wherein the amplifier comprises a differential pair of transistors.

14. The apparatus of claim 9, wherein the amplifier comprises an inverter.

15. The apparatus of claim 9, wherein the current source comprises a transistor configured to operate in linear regime.

16. The apparatus of claim 15, wherein the current source comprises an n-type metal-oxide semiconductor (NMOS) transistor configured to be operated in linear regime and a p-type metal-oxide semiconductor (PMOS) transistor configured to be operated in linear regime, and the current source is configured to output a current dependent on both a current flowing through the NMOS transistor and a current through the PMOS transistor.

17. The apparatus of claim 9, further comprising a second switch configured to selectively control the electronic circuit between a sleep mode and an active mode.

18. An apparatus, comprising:
a circuit portion;
a switch configured to selectively couple a supply voltage input of the circuit portion to a supply voltage;
a current source configured to generate a first current that is smaller than or equal to a current flowing through the supply voltage input of the circuit portion during a normal operation of the circuit portion; and
a control circuit configured to control a state of the switch depending on the first current,
wherein the circuit portion comprises a memory circuit, and wherein the current flowing through the supply voltage input of the circuit portion during the normal operation is an access current of the memory circuit.

19. An apparatus, comprising:
a circuit portion;
a first switch having a control input and configured to selectively couple an input of the circuit portion to a supply voltage;
a current source configured to generate a first current;
a control circuit configured to control a state of a first switch so as to depend on the first current; and
a second switch configured to selectively couple the control input of the first switch with the supply voltage,
wherein the control circuit comprises an operational amplifier, an output of the operational amplifier being coupled with the control input of the first switch.

20. The apparatus of claim 19, wherein the apparatus is configured such that when the first switch is coupling the input of the circuit portion to the supply voltage, a current flowing through the input of the circuit portion is maintained at a constant value for a predetermined time period.

21. The apparatus of claim 19, wherein the first switch comprises a transistor.

22. The apparatus of claim 19, wherein the control circuit comprises at least a portion of a current mirror circuit.

* * * * *